United States Patent
Wang et al.

(10) Patent No.: US 12,077,684 B2
(45) Date of Patent: Sep. 3, 2024

(54) TEMPORARY ADHESIVE, TEMPORARY ADHESIVE ASSEMBLY, AND METHOD OF PROCESSING SUBSTRATE

(71) Applicant: PhiChem Corporation, Shanghai (CN)

(72) Inventors: Yaosen Wang, Shanghai (CN); Xiaoyi Gao, Shanghai (CN); Dongchen Ji, Shanghai (CN)

(73) Assignee: PhiChem Corporation, Shanghai (CN)

(*) Notice: Subject to any disclaimer, the term of this patent is extended or adjusted under 35 U.S.C. 154(b) by 525 days.

(21) Appl. No.: 17/449,410

(22) Filed: Sep. 29, 2021

(65) Prior Publication Data
US 2022/0098456 A1    Mar. 31, 2022

(30) Foreign Application Priority Data
Sep. 29, 2020 (CN) .......................... 202011057611.1

(51) Int. Cl.
*C09J 171/00* (2006.01)
*C09J 5/00* (2006.01)
(Continued)

(52) U.S. Cl.
CPC .............. *C09J 171/00* (2013.01); *C09J 5/00* (2013.01); *C09J 163/00* (2013.01); *C09J 169/00* (2013.01);
(Continued)

(58) Field of Classification Search
CPC .............. C08G 2650/40; C08G 2650/56; C98J 163/00; C98J 169/00; C98J 171/00;
(Continued)

(56) References Cited

U.S. PATENT DOCUMENTS

| | | | |
|---|---|---|---|
| 2005/0170612 A1* | 8/2005 | Miyanari | ............ H01L 21/6835 438/464 |
| 2014/0242757 A1 | 8/2014 | Yoko et al. | |

(Continued)

FOREIGN PATENT DOCUMENTS

| | | |
|---|---|---|
| CN | 105103267 A | 11/2015 |
| CN | 111534270 A | 8/2020 |

(Continued)

OTHER PUBLICATIONS

First office action in Taiwanese application No. 110136062 issued on Jun. 6, 2022.

(Continued)

*Primary Examiner* — Philip C Tucker
*Assistant Examiner* — Brian R Slawski
(74) *Attorney, Agent, or Firm* — Knobbe, Martens, Olson & Bear, LLP

(57) ABSTRACT

A temporary adhesive includes: a polar resin of 5 wt % to 50 wt %, a first solvent of 30 wt % to 90 wt %, and a second solvent of 5 wt % to 60 wt %, wherein the polar resin includes at least one selected from a group consisting of a phenoxy resin, a poly(ether-ether-ketone) resin, a polycarbonate resin, a modified epoxy resin, or a polyolefin resin with a modified polar group; the first solvent is used to dissolve the polar resin; and the second solvent is used to improve a leveling property of the temporary adhesive.

20 Claims, 4 Drawing Sheets

(51) Int. Cl.
*C09J 163/00* (2006.01)
*C09J 169/00* (2006.01)
*H01L 21/56* (2006.01)
*H01L 21/683* (2006.01)

(52) U.S. Cl.
CPC ........ *H01L 21/568* (2013.01); *H01L 21/6835* (2013.01)

(58) Field of Classification Search
CPC ................ C98J 171/10; C98J 2203/326; C98J 2301/408; C98J 2301/502; C98J 2461/00; C98J 2463/00; C98J 2469/00; C98J 2479/08; C98J 5/00; H01L 21/568; H01L 21/6835; H01L 2221/68318; H01L 2221/68327; H01L 2221/6834; H01L 2221/68381
USPC ......... 156/60, 153, 154, 247, 325, 327, 330, 156/335, 701, 703, 711, 712; 427/99.2, 427/99.3, 99.4; 428/343, 354, 355 R, 428/355 EP
See application file for complete search history.

(56) References Cited

U.S. PATENT DOCUMENTS

| | | |
|---|---|---|
| 2016/0104635 A1 | 4/2016 | Koyama et al. |
| 2018/0012751 A1 | 1/2018 | Kamochi et al. |
| 2018/0215965 A1 | 8/2018 | Fukuhara et al. |
| 2018/0244965 A1 | 8/2018 | Mowrey et al. |
| 2019/0157128 A1 | 5/2019 | Ishii et al. |

FOREIGN PATENT DOCUMENTS

| | | |
|---|---|---|
| TW | 201323558 A | 6/2013 |
| TW | 201639939 A | 11/2016 |
| TW | 201920579 A | 6/2019 |

OTHER PUBLICATIONS

First office action of counterpart Chinese application No. 202011057611.1 issued on Apr. 8, 2023.

* cited by examiner

TEMPORARY ADHESIVE, TEMPORARY ADHESIVE ASSEMBLY, AND METHOD OF PROCESSING SUBSTRATE

CROSS-REFERENCE TO RELATED APPLICATION

This application is based on and claims priority to the Chinese Patent Application No. 202011057611.1, filed on Sep. 29, 2020 and entitled "TEMPORARY ADHESIVE, AND APPLICATION AND APPLICATION METHOD THEREOF", the disclosure of which is herein incorporated by reference in its entirety.

TECHNICAL FIELD

The present disclosure relates to the field of packaging technologies for semiconductor, and more particularly, to a temporary adhesive, a temporary adhesive assembly, and a method of processing a substrate.

BACKGROUND

In the field of fabrication, some parts to be processed must be temporarily attached to a support. For example, a relatively thin semiconductor wafer is usually used in the semiconductor field. Taking such relatively thin semiconductor wafer being a thin silicon wafer as an example, in the process of processing the thin silicon wafer, a thick silicon wafer needs to be polished to obtain the thin silicon wafer and then a fine structure will be fabricated on the thin silicon wafer. However, the thin silicon wafer has the defect of being prone to cracking, difficult to be fixed and processed, and the like. Therefore, it needs to adhere the thin silicon wafer to a thicker support (e.g., a glass sheet at a millimeter scale) by a temporary adhesive to form a temporary adhesive assembly. Then, after the treatments such as grinding, polishing, coating with photoresist, developing, etc., the thin silicon wafer needs to be detached from the support (also referred to as a debonding procedure).

SUMMARY

The embodiments of the present disclosure provide a temporary adhesive, a temporary adhesive assembly, and a method of processing a substrate, and in particular, include the following technical solutions.

A first aspect of the present disclosure provides a temporary adhesive including a polar resin of 5 wt % to 50 wt %, a first solvent of 30 wt % to 90 wt %, and a second solvent of 5 wt % to 60 wt %, wherein the polar resin includes at least one selected from a group consisting of a phenoxy resin, a poly(ether-ether-ketone) resin, a polycarbonate resin, a modified epoxy resin, or a polyolefin resin with a modified polar group;

the first solvent is used to dissolve the polar resin; and
the second solvent is used to improve a leveling property of the temporary adhesive.

In some possible implementations, the polar resin has a number average molecular weight of between 10,000 and 100,000, and a MWD of between 1 and 3.5.

In some possible implementations, the first solvent includes at least one selected from a group consisting of an ester-based solvent, a ketone-based solvent, a sulfone-based solvent, or an amide-based solvent.

In some possible implementations, the first solvent includes at least one selected from a group consisting of ethyl 3-ethoxypropionate, ethyl acetate, n-butyl acetate, ethyl lactate, γ-butyrolactone, methyl ethyl ketone, methyl isobutyl ketone, isophorone, propylene glycol methyl ether acetate, dimethyl sulfoxide, dimethyl sulfone, dimethylacetamide, or N,N-dimethylformamide.

In some possible implementations, the second solvent includes at least one selected from a group consisting of an ester-based solvent, a ketone-based solvent, a sulfone-based solvent, or an amide-based solvent.

In some possible implementations, the second solvent includes at least one selected from a group consisting of N-methylpyrrolidone, N,N-dimethylformamide, cyclohexanone, or cyclopentanone.

In some possible implementations, the temporary adhesive further includes a light blocking material, wherein a weight percentage of the light blocking material in the temporary adhesive is between 0.1 wt % and 20 wt %.

In some possible implementations, the light blocking material includes at least one selected from a group consisting of a metal powder, a metal oxide powder, a carbon powder, or an organic substance having an absorption effect on ultraviolet light of a wavelength from 290 nm to 350 nm.

In some possible implementations, the metal powder includes at least one of aluminum powder, or silver powder;
the metal oxide powder includes at least one of titanium dioxide powder, aluminum oxide powder, magnesium oxide powder, or calcium oxide powder;
the organic substance having the absorption effect on the ultraviolet light of the wavelength from 290 nm to 350 nm includes at least one of an organic substance including an amide group and/or an imide group, UV absorber UV390, UV absorber UV571, UV absorber UV572, Cadino, or benzotriazole.

In some possible implementations, the light blocking material has a particle size ranging from 0.2 μm to 40 μm.

A second aspect of the present disclosure provides a temporary adhesive assembly, wherein the temporary adhesive assembly includes a target substrate which is a substrate to be processed, a carrier substrate, and an adhesive glue layer, and the target substrate is adhered to the carrier substrate by the adhesive glue layer; and
wherein the adhesive glue layer includes a first glue layer formed from the temporary adhesive described above.

In some possible implementations, the adhesive glue layer further includes a second glue layer, the first glue layer and the second glue layer are in a stacked configuration and the second glue layer is formed from a photosensitive adhesive; and
the first glue layer is adhered to the target substrate, and the second glue layer is adhered to the carrier substrate.

In some possible implementations, the target substrate is a semiconductor wafer.

In some possible implementations, the carrier substrate includes a wafer substrate, a glass substrate, a quartz substrate, a silica substrate, or a thermally stable polymer substrate.

A third aspect of the present disclosure provides a method of processing a target substrate, includes: applying the temporary adhesive described above to the target substrate.

In some possible implementations, the method includes: providing a carrier substrate and the target substrate, wherein the carrier substrate has a support surface and the target substrate has a first surface and a second surface that are opposite to each other;
adhering the support surface of the carrier substrate to the first surface of the target substrate by an adhesive glue layer to form a temporary adhesive assembly, wherein the adhesive glue layer includes a first glue layer formed from the temporary adhesive;

treating the second surface of the target substrate on the temporary adhesive assembly to obtain a treated temporary adhesive assembly;

performing a debonding process on the treated temporary adhesive assembly to detach the first surface of the target substrate from the carrier substrate; and cleaning the temporary adhesive remained on the first surface of the target substrate to obtain a processed target substrate.

In some possible implementations, the adhesive glue layer further includes a second glue layer, the second glue layer and the first glue layer are in a stacked configuration, and the second glue layer is formed from a photosensitive adhesive.

In some possible implementations, treating the second surface of the target substrate on the temporary adhesive assembly, includes:

performing a wafer thinning treatment, a stress releasing treatment, a dry etch treatment, a redistribution line packaging treatment, a physical vapor deposition treatment, or a ball mounting treatment to the second surface of the target substrate.

In some possible implementations, the debonding process includes: a heat debonding process, a chemical solvent debonding process, or a laser debonding process; and the laser debonding process is applied to the second glue layer to perform the debonding process.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following descriptions show merely some embodiments of the present disclosure, and persons of ordinary skill in the art may still derive other drawings from these accompanying drawings without creative efforts.

DETAILED DESCRIPTION

Figure 1:
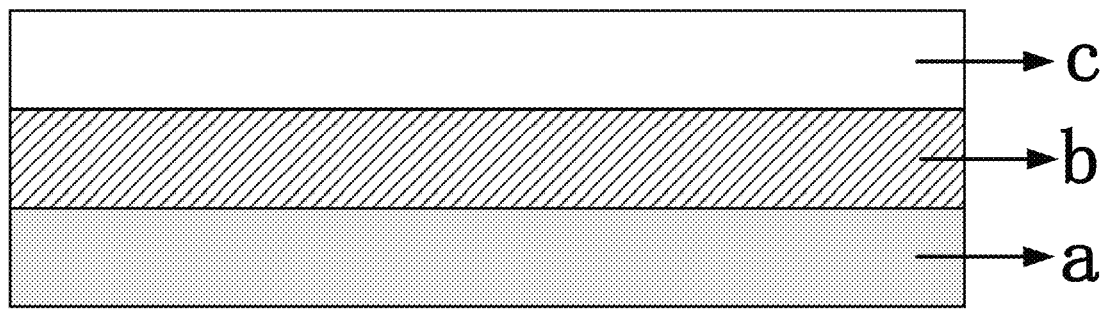
FIG. 1 is a schematic structural diagram of an example temporary adhesive assembly according to an embodiment of the present disclosure.

In order to make the objects, technical solutions, and advantages of the present disclosure clearer, the embodiments or implementations of the present disclosure will be described hereinafter in combination with the accompanying drawings in detail.

Unless otherwise described, all technical or scientific terms used in the present disclosure have the same meaning as the ordinary meaning understood by persons of ordinary skill in the art to which the present disclosure belongs. If a definition of a specific term disclosed in the related art is not consistent with any definitions provided in the present disclosure, the definition of the term provided in the present disclosure shall prevail.

Unless otherwise clearly indicated, the singular forms "a", "an", and "the" include plural referents. It shall be further understood that the term "made of" and the term "included" have the same meaning, "comprising," "including," and "having" (and conjugations thereof) are used interchangeably to mean including but not necessarily limited to, and are open-ended terms not intended to exclude additional, unrecited elements or method steps. Further, when describing the embodiments of the present disclosure, the terms "preferred", "preferably", "more preferably" and the like mean that the embodiments or implementations of the present disclosure may achieve certain advantages in some cases. However, other embodiments may also be preferred in the same case or in other cases. In addition, the descriptions on one or more preferable embodiments neither imply that other embodiments are not available, nor intend to exclude other embodiments from the scope of the present disclosure.

The temporary adhesives provided in the related art are susceptible to the following issues during the processing procedures of the temporary adhesive assembly.

Some temporary adhesives provided in the related art may be not resistant to high temperature or solvent. Some processing procedures, such as physical vapor deposition (PVD), solder ball reflow process and the like, need to be performed at a relatively high temperature which is generally higher than 100° C., even up to 260° C. for a time period as long as 10 min. This may cause the temporary adhesive to dissolve, thereby causing damages to the thin silicon wafer. Further, some processing procedures, such as the processes like developing, de-gluing, etching or the like, may involve the use of solvents, and the solvents as used are generally corrosive. If the temporary adhesive does not have sufficient resistance to these solvents, the temporary adhesive assembly will be disassembled, further causing the damage of the thin silicon wafer.

As for the debonding process, the methods for achieving debonding include, but are not limited to: (1) a mechanical force debonding process, which is simple, efficient and low in cost, but is easy to damage the thin silicon wafer; (2) a heat debonding process, which is simple and convenient; (3) a chemical solvent debonding process, which is simple, convenient, and low in cost; and (4) a laser debonding process, which is simple and efficient.

Therefore, the temporary adhesives meeting the following requirements are desired: (1) the temporary adhesives have a stable bonding state during the temporary adhesive application, and cannot be affected by the environment, the environment including but not limited to: temperature, solvent, etc.; and (2) the temporary adhesives can be easily converted from the bonding state to a debonding state.

However, the temporary adhesives that have been disclosed by the related are are difficult to meet all of the above requirements simultaneously, which greatly limits the application of the temporary adhesives.

Some embodiments of the present disclosure provide a temporary adhesive including the following components: a polar resin of 5 wt % to 50 wt %, a first solvent of 30 wt % to 90 wt %, and a second solvent of 5 wt % to 60 wt %.

Here, the polar resin is a resin including a polar group, the first solvent is used to dissolve the polar resin, and the second solvent is used to improve a leveling property of the temporary adhesive.

For example, the weight percentage of the polar resin in the temporary adhesive includes, but is not limited to, 5%, 10%, 15%, 20%, 25%, 30%, 35%, 40%, 45%, 50%, etc.

For example, the weight percentage of the first solvent in the temporary adhesive includes, but is not limited to, 30%, 35%, 40%, 45%, 50%, 55%, 60%, 65%, 70%, 75%, 80%, 85%, 90%, etc.

For example, the weight percentage of the second solvent in the temporary adhesive includes, but is not limited to, 5%, 10%, 15%, 20%, 25%, 30%, 35%, 40%, 45%, 50%, 55%, 60%, etc.

In some examples, the temporary adhesive includes components of the following weight percentages: a polar resin of 5 wt % to 30 wt %, a first solvent of 30 wt % to 50 wt %, and a second solvent of 40 wt % to 60 wt %.

The polar resins in the present disclosure refer to resins each having a polar group in their structures, and the polar group can act as an active group. Through the interaction of the active group, the temporary adhesive can be provided with certain specific properties in terms of viscosity, bonding capacity, heat resistance and/or chemical reagent resistance.

In some possible implementations, the polar resin includes at least one of a phenoxy resin, a PEEK resin, a polycarbonate resin, a modified epoxy resin, or a polyolefin resin with a modified polar group.

For example, the phenoxy resin may include, but is not limited to, at least one of the following commercially available phenoxy resin products: PKHC, PKHH, PKHJ, or PKHB.

In some possible implementations, the polar resins provided in the embodiments of the present disclosure may be commercially available resin products, such as the resins produced by Inchem, Gabriel, NIPPON Steel Chemical, or products with the catalog numbers such as YP-50, YP-50EK35, YP-50S, YP-55, YP-70, etc.

Here, YP-50 is a modified cycloaliphatic diglycidyl ether epoxy resin, which belongs to the modified epoxy resins. YP-50EK35 is a grafted chlorinated polyethylene/polypropylene thermoplastic elastomer, which belongs to the polyolefin resins with modified polar group; YP-50S, YP-55, and YP-70 each are ultra-high molecular weight phenoxy resins of a BPA type, which belong to the phenoxy resins.

In some possible implementations, the polar resins may have a number average molecular weight of between 10,000 and 100,000 and a MWD of between 1 and 3.5, with a solution viscosity of between 300 cps to 900 cps at a concentration of 20 wt % in a cyclohexanone solution at 25° C.

For example, the number average molecular weight of the polar resin may include, but is not limited to, 10000, 15000, 20000, 21000, 25000, 26000, 30000, 32000, 35000, 40000, 45000, 50000, 52000, 55000, 60000, 65000, 70000, 75000, 80000, 85000, 90000, 95000, 100000, etc.

The MWD of the polar resins may include, but is not limited to, 1, 1.2, 1.5, 2, 2.5, 3, 3.5, etc.

The solution viscosity of the polar resins in a cyclohexanone solution at 25° C. at a concentration of 20 wt % may include, but is not limited to, 300 cps, 350 cps, 400 cps, 450 cps, 500 cps, 550 cps, 600 cps, 650 cps, 700 cps, 750 cps, 800 cps, 850 cps, 900 cps, etc.

For example, the polar resin may have a number average molecular weight of between 20,000 and 40,000 and a MWD of between 1.5 and 2.5, and a solution viscosity of between 600 cps to 800 cps at a concentration of 20 wt % in a cyclohexanone solution at 25° C.

The aforementioned polar resin materials described in the embodiments of the present disclosure can be provided with certain properties in terms of viscosity, bonding capacity, heat resistance and/or chemical reagent resistance, due to the interaction between the respective corresponding polar groups, i.e., the reactive groups.

The inventors have found that when the addition of the polar resin in the temporary adhesive is too low, the surface of the adhesive layer would be too dry and have an insufficient bonding capacity (the adhesive layer is formed from the temporary adhesive); and when the addition of the polar resin in the temporary adhesive is too high, the viscosity of the temporary adhesive would be too great and difficult to manipulate. Therefore, in the embodiments of the present disclosure, the weight percentage of the polar resin in the temporary adhesive is between 5 wt % and 50 wt %. As such, the viscosity of the temporary adhesive is moderate, which may facilitate the film coating process, and the adhesive layer can achieve an excellent bonding capacity.

The inventors have further found that when the molecular weight of the polar resin is too high, the polar resin is not easy to dissolve; and when the molecular weight of the polar resin is too low, both the chemical resistance and a solvent resistance of the polar resin are insufficient. Therefore, in the embodiments of the present disclosure, when the polar resin has the number average molecular weight of between 10,000 and 100,000, the temporary adhesive can not only be easy to dissolve, but also be provided with an excellent chemical resistance and the solvent resistance.

In the embodiments of the present disclosure, methods of measuring the number average molecular weight and the MWD of the polar resin may be any methods known to those skilled in the art, such as gel chromatography. Methods of measuring the viscosity of the resin solution may be any methods known to those skilled in the art, for example, by using a viscometer.

During the test, the measurement of the number average molecular weight fluctuates by around ±20%, and deviations of the MWD and the viscosity test are at around 10%.

In the embodiments of the present disclosure, the first solvent is used to dissolve the polar resin described above to form a homogenous resin solution.

In some possible implementations, the first solvent includes at least one selected from a group consisting of an ester-based solvent, a ketone-based solvent, a sulfone-based solvent, or an amide-based solvent.

For the ester-based solvent, For example, the ester-based solvent may include, but is not limited to, at least one of ethyl acetate, n-butyl acetate, ethyl 3-ethoxypropionate (EEP), γ-butyrolactone (GBL), propylene glycol methyl ether acetate (PGMEA), isopropyl acetate, or ethyl lactate.

For the ketone-based solvent, For example, the ketone-based solvent may include, but is not limited to, at least one of methyl ethyl ketone, methyl isobutyl ketone, isophorone, or acetone.

For the sulfone-based solvent, For example, the sulfone-based solvent may include, but is not limited to, at least one of dimethyl sulfoxide (DMSO), or dimethyl sulfone (DMS).

For the amide-based solvent, For example, the amide-based solvent may include, but is not limited to, at least one of dimethylacetamide (DMAC), or N,N-dimethylformamide (DMF).

For example, the first solvent may include at least one selected from a group consisting of ethyl 3-ethoxypropionate, ethyl acetate, n-butyl acetate, ethyl lactate, γ-butyrolactone, methyl ethyl ketone, methyl isobutyl ketone, isophorone, propylene glycol methyl ether acetate, or dimethyl sulfoxide.

In the embodiments of the present disclosure, the first solvent is used to dissolve the resin. The inventors have found that when the addition of the first solvent is too low, the dissolving efficiency of the polar resin would be relatively low; and when the addition of the first solvent is too high, the addition of other components in the temporary adhesive would be affected, so that a solid content of the temporary adhesive is reduced, causing the adhesive layer too thin to affect the bonding effect. Therefore, the embodiments of the present disclosure set the weight percentage of the first solvent in the temporary adhesive to be in the range of between 30 wt % and 90 wt %, so as to make the temporary adhesive have a suitable solid content under the premise of ensuring quick dissolution of the polar resin.

In the embodiments of the present disclosure, the second solvent is used to improve a leveling effect of the coating of the temporary adhesive. In some possible implementations, the second solvent includes at least one of an ester-based solvent, a ketone-based solvent, a sulfone-based solvent, or an amide-based solvent.

For example, the second solvent may include at least one selected from a group consisting of N-methylpyrrolidone, N,N-dimethylformamide, cyclohexanone, or cyclopentanone.

The second solvent in the embodiments of the present disclosure may improve the leveling effect of the coating of the adhesive. The inventors have found that the first solvent dries fast in the baking process, and by adding the second solvent, the volatilizing speed can be adjusted appropriately and the temporary adhesive can be uniformly spread. When the addition of the second solvent is too low, the leveling effect still does not achieve the requirement, which causes the adhesive glue layer to form a non-flat surface after the temporary adhesive is coated and affects the subsequent application. When the addition of the second solvent is too high, the adding amounts of other components in the temporary adhesive will be affected, which causes a bumping phenomenon during the baking process of the liquid film formed from the temporary adhesive and results in a poor film forming effect. Therefore, the embodiments of the present disclosure set the weight percentage of the second solvent in the temporary adhesive to be in the range of between 5 wt % and 60 wt %, which can ensure an excellent leveling effect of the liquid film formed from the temporary adhesive while ensuring that the liquid film can be baked to smoothly form a coating.

The inventors have further found that some temporary adhesives provided in the related art only have a limited light blocking effect. In some laser debonding processes, when the laser has a relatively high energy transmittance but the adhesive glue layer does not have a light absorbing capability, or the debonding energy is too high, a spot may be formed after the substrate is irradiated with laser, causing a laser scratch on the surface of the chip, which may in turn result in issues such as poor contact, and the like.

In some possible implementations, the temporary adhesive provided in the embodiments of the present disclosure may further include a light blocking material for reducing a UV transmittance of the adhesive glue layer formed from the temporary adhesive. Here, a weight percentage of the light blocking material in the temporary adhesive is between 0.1 wt % and 20 wt %. By adding the light blocking material in the above-described proportion in the temporary adhesive, the UV transmittance of the adhesive glue layer can be effectively reduced, so that the temporary adhesive would be suitable for laser debonding process.

For example, the weight percentage of the light blocking material in the temporary adhesive may include, but is not limited to, 0.1%, 0.5%, 1%, 1.5%, 2%, 2.5%, 3%, 4%, 5%, 8%, 10%, 12%, 15%, 18%, 20%, etc. Further, the weight percentage of the light blocking material in the temporary adhesive is between 0.1 wt % and 10 wt %.

In some possible implementations, the light blocking material may include at least one selected from a group consisting of a metal powder, a metal oxide powder, a carbon powder, or an organic substance having an absorption on UV light of a wavelength from 290 nm to 350 nm.

For the metal powder, For example, the metal powder may include, but is not limited to, aluminum powder, silver powder, and the like. For the metal oxide powders, For example, the metal oxide powder may include, but is not limited to, titanium dioxide powder, aluminum oxide powder, magnesium oxide powder, calcium oxide powder, and the like.

For the organic substance having the absorption on UV light of the wavelength from 290 nm to 350 nm, such organic substance may include, but is not limited to, organic substances including an amide (—NH—R—) group and/or an imide (R—CO—NR'—CO—R") group, UV absorber UV390, UV absorber UV571 (CAS number: 23328-53-2), UV absorber UV572, Cadino (CAS number: 5392-67-6), benzotriazole (CAS number: 95-14-7), and the like.

In some examples, the light blocking material may include at least one selected from a group consisting of carbon powder, aluminum powder, the UV 390, the UV 571, or the UV 572.

The above-mentioned kinds of light blocking materials involved in the embodiments of the present disclosure can reduce the laser transmittance of the adhesive glue layer to 20% when a film thickness of the adhesive glue layer is at the level of 20 micrometers. Further, the presence of the respective light blocking materials above would not affect the debonding step and cleaning step of the adhesive glue layer.

The inventors have found that when the addition of the light blocking material is too low, the reduction of the light transmittance of the adhesive glue layer is less effective, and when the addition of the light blocking material is too high, the bonding effect of the temporary adhesive will be adversely affected. Therefore, in the embodiments of the present disclosure, the weight percentage of the light blocking material in the temporary adhesive is set to be between 0.1 wt % and 20 wt %, so as to ensure both good light blocking effect and bonding effect.

To balance the light blocking effect and the application effect of the temporary adhesive system, in some possible implementations, when the light blocking material is a granular material selected from the metal powder, the metal oxide powder, the carbon powder, and the like, the light blocking material may have a particle size ranging from 0.2 μm to 40 μm.

For example, the particle size of the light blocking material may be, but is not limited to, 0.2 μm, 0.5 μm, 1 μm, 2 μm, 2.5 μm, 5 μm, 10 μm, 15 μm, 20 μm, 25 μm, 30 μm, 35 μm, 40 μm, or therebetween.

For example, in the embodiments of the present disclosure, the light blocking material may have a particle size ranging from 0.5 μm to 20 μm. Within the above particle size range, the light blocking material can not only avoid particle residue in a bump structure of a bonding surface to obtain an excellent light shielding effect, but also ensure a flat coating surface of the temporary adhesive.

After the temporary adhesives provided in the embodiments of the present disclosure form an adhesive glue layer, the respective components of the temporary adhesives can be cleaned with a solvent. The resistance and bonding capacity of the temporary adhesives provided in the embodiments of the present disclosure are determined by the characters of the polar resin. After a large number of experiments, the inventors have selected the various polar resins shown above to form the temporary adhesive which can withstand a temperature as high as 300° C. In this case, the temporary adhesives can also withstand the corrosion or soaking of acids, bases in the solvents, and non-polar organic solvents such as benzene-based solvents, hydrocarbon-based solvents, and the like, and the bonding capacity of the formed adhesive glue layer would not be affected. In addition, depending on the used polar resin and the characteristic of the structure thereof, one or more suitable light blocking materials can be selected to accommodate to the specific polar resin (which may be obtained by an orthogonal experiment) so as to achieve an excellent light blocking effect.

In summary, by selecting a particular polar resin, combining a suitable first solvent and a suitable second solvent, the temporary adhesives provided in the present disclosure can have the advantages of being easy to clean; having resistance against high temperature, having resistance when being soaked in acid, base, and non-polar organic solvents; and being easy to coat and apply. And the use of an appropriate light blocking material may further impart the temporary adhesive with a laser resistance performance. The temporary adhesives provided in the embodiments of the present disclosure can be used in the field of semiconductor packaging, improving the yield in wafer processing.

Some embodiments of the present disclosure provide a temporary adhesive assembly including a target substrate, a carrier substrate, and an adhesive glue layer, and the target substrate is adhered to the carrier substrate by the adhesive glue layer.

Here, the adhesive glue layer may have a thickness ranging from 1 μm to 10 μm, such as 1 μm, 2 μm, 3 μm, 4 μm, 5 μm, 6 μm, 7 μm, 8 μm, 9 μm, 10 μm, or therebetween.

The adhesive glue layer within this thickness range can have a great bonding effect, is not prone to debonding, and would not tangentially displace during the processing procedures.

In some examples, the adhesive glue layer may include a first glue layer formed from any of the temporary adhesives described above in the embodiments of the present disclosure.

In some other examples, the adhesive glue layer may further include a second glue layer, the first glue layer and the second glue layer are in a stacked configuration; the second glue layer is formed from a photosensitive adhesive, wherein the first glue layer is adhered to the target substrate, and the second glue layer is adhered to the carrier substrate.

The photosensitive adhesive refers to an adhesive which can be debonded by laser, for example, the photosensitive adhesive may be BrewerBOND®701 photosensitive glue material produced and sold by Brewer Science Inc., LB210 photosensitive glue produced and sold by Shenzhen Wasun-Semiconductor Materials Inc., KS1500 photosensitive glue produced and sold by PhiChem Corporation, and the like.

In some examples, a thickness of the second glue layer is less than or equal to 2 μm, such as 2 μm, 1.8 μm, 1.5 μm, 1.3 μm, 1 μm, 0.8 μm, 0.5 μm, or therebetween, so as to achieve a suitable bonding effect and an excellent debonding effect.

For example, the target substrate in the temporary adhesive assembly may be a semiconductor wafer to be treated, for example, a semiconductor wafer to be thinned.

The carrier substrate generally has a support surface, and the target substrate has a first surface and a second surface that are opposite to each other. For example, the first surface may be used to form a circuit, and the second surface may be used to be processed. For an adhesive glue layer including only the first glue layer, one side of the adhesive glue layer is adhered to the support surface of the carrier substrate, and the other side of the adhesive glue layer is adhered to the first surface of the target substrate. For an adhesive glue layer including both the first glue layer and the second glue layer, the second glue layer is adhered to the support surface of the carrier substrate, and the first glue layer is adhered to the first surface of the target substrate.

In some examples, after forming the temporary adhesive assembly, the second surface of the target substrate in the temporary adhesive assembly can be treated, and the method for treating the second surface may for example include, but is not limited to, a wafer thinning treatment, a stress releasing treatment, a dry etch treatment, a redistribution line (RDL) packaging treatment, a physical vapor deposition treatment, a ball mounting treatment and the like.

The temporary adhesive assembly provided in the embodiments of the present disclosure can be used in semiconductor packaging fields. In some examples, the target substrate described above is a semiconductor wafer, such as a single-chip wafer, a multi-chip wafer, or the like. For example, a material of the semiconductor wafer may include, but is not limited to, a glass, a sapphire, a silicate, silicon nitride, silicon carbide, silicon crystal, gallium arsenide, and the like.

The carrier substrate in the embodiments of the present disclosure may be any suitable supports. For example, the carrier substrate may include, but is not limited to, a wafer, a glass (e.g., borosilicate glass), quartz, silicon dioxide, a thermally stable polymer, or the like. A material of the wafer used as the carrier substrate may include, but is not limited to, silicon, silicon carbide, silicon germanium, silicon nitride, gallium arsenide, sapphire, and the like.

Some embodiments of the present disclosure provide a method of processing a substrate, and the method uses any of the temporary adhesives described above.

Figure 7:
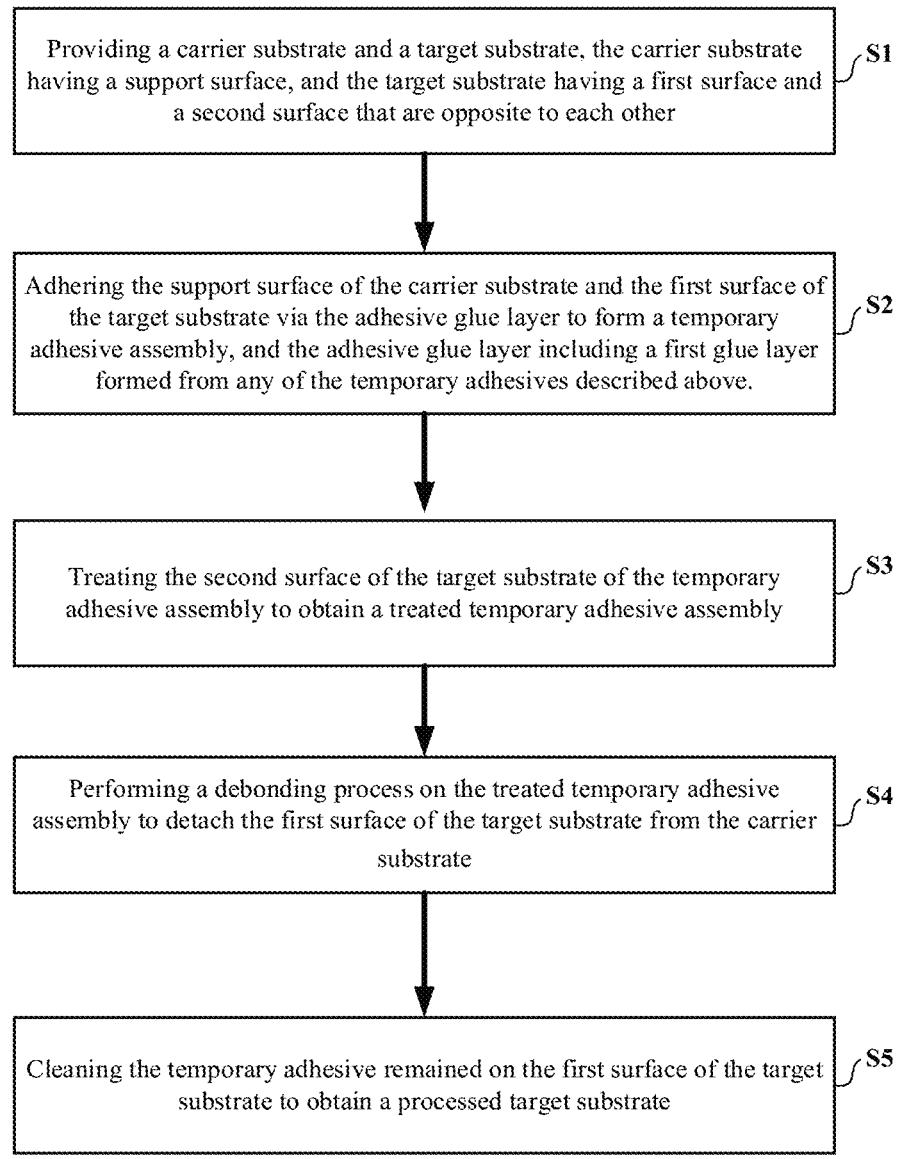
FIG. 7 is a flowchart showing an example method of processing a target substrate according to an embodiment of the present disclosure.

In some examples, as shown in FIG. 7, the method of processing the substrate includes the following steps.

In step S1, a carrier substrate and a target substrate are provided, wherein the carrier substrate has a support surface, and the target substrate has a first surface and a second surface that are opposite to each other. For example, the first surface is used to form a circuit, the second surface is used to be processed. One side of the adhesive glue layer is adhered to the support surface of the carrier substrate, and the other side of the adhesive glue layer is adhered to the first surface of the target substrate.

In step S2, the support surface of the carrier substrate and the first surface of the target substrate are adhered via the adhesive glue layer to form a temporary adhesive assembly. Here, the adhesive glue layer includes a first glue layer formed from any of the temporary adhesives described above. Further, the adhesive glue layer may further include a second glue layer, the second glue layer and the first glue layer are disposed in a stacked configuration, and the second glue layer may be formed from a photosensitive adhesive.

In step S3, the second surface of the target substrate of the temporary adhesive assembly is treated to obtain a treated temporary adhesive assembly. In the treated temporary adhesive assembly, the second surface of the target substrate has been treated by a particular treatment to form a treated target substrate. For example, the particular treatment may include, but is not limited to, a wafer thinning treatment, a stress releasing treatment, a dry etch treatment, a redistribution line packaging treatment, a physical vapor deposition treatment, and a ball mounting treatment and the like.

In step S4, a debonding process is performed on the treated temporary adhesive assembly to detach the first surface of the target substrate from the carrier substrate.

In step S5, the temporary adhesive remained on the first surface of the target substrate is cleaned to obtain a processed target substrate.

The debonding process to the treated temporary adhesive assembly described above refers to the process of debonding the adhesive glue layer in the temporary adhesive assembly, wherein the adhesive glue layer includes a first glue layer which is prepared from the temporary adhesive.

In some examples, the adhesive glue layer may be prepared by using the temporary adhesive to form a first glue layer and using a photosensitive adhesive capable of being debonded by laser to form a second glue layer.

In some possible implementations, the above-described debonding process on the adhesive glue layer includes: a heat debonding process, a chemical solvent debonding process, or a laser debonding process.

When the adhesive glue layer is merely prepared using the above-described temporary adhesive in the embodiments of the present disclosure, a heat debonding process or the chemical solvent debonding process can be used. Here, the heat debonding process refers to a process of debonding the adhesive glue layer by heating and softening the adhesive glue layer, and the chemical solvent debonding process refers to a chemical process of dissolving and debonding the adhesive glue layer by using a chemical solvent.

Here, the operating parameters of the heat debonding process may be as follows: softening the adhesive glue layer at a temperature of 160° C. to 200° C. for a duration of 30 min to 60 min. The operating parameters of the chemical solvent debonding process may be as follows: soaking the entire temporary adhesive assembly in a good solvent of the glue layer at a temperature of 25° C. to 60° C. (e.g., the first solvent described above in the embodiments of the present disclosure, such as γ-butyrolactone) for a duration of more than 30 min.

When the adhesive glue layer is simultaneously prepared using the temporary adhesive and the photosensitive adhesive provided in the embodiments of the present disclosure, the laser debonding process may be used to debond the adhesive glue layer. Here, the laser debonding process refers to a process of using laser irradiation to debond the adhesive glue layer. In this case, the adhesive glue layer includes the first glue layer and the second glue layer that are in a stacked configuration, wherein the first glue layer is made from the temporary adhesive and the second glue layer is made from the photosensitive adhesive.

The methods of applying the temporary adhesive provided in the embodiments of the present disclosure will be described clearly and completely hereinafter in combination with the accompanying drawings. Apparently, the described embodiments are merely partial embodiments of the present disclosure, rather than all of the embodiments. Based on the embodiments of the present disclosure, all other implementations obtained by those skilled in the art without creative efforts will fall within the protection scope of the embodiments of the present disclosure.

The temporary adhesive provided in the embodiments of the present disclosure may be applied through the following steps.

The target substrate and the carrier substrate are adhered using the temporary adhesive described above. As shown in FIG. 1, layer a and layer c are substrates that need to be adhered together, and materials of the layer a and layer c may be a metal, a glass, a silicon wafer, or the like. In this embodiment, the layer a is a carrier substrate which is relatively thick, and the material of layer a may, for example, be a glass. The layer c is a target substrate which is relatively thin, and the material of layer c may, for example, be a silicon wafer. Layer b is an adhesive glue layer including a first glue layer prepared from a temporary adhesive provided in the embodiments of the present disclosure. The layer b is used for adhering layer a to layer c, and in actual use, whether to add a light blocking material to the temporary adhesive can be selected depending on whether there is a light-blocking requirement.

Figure 2:
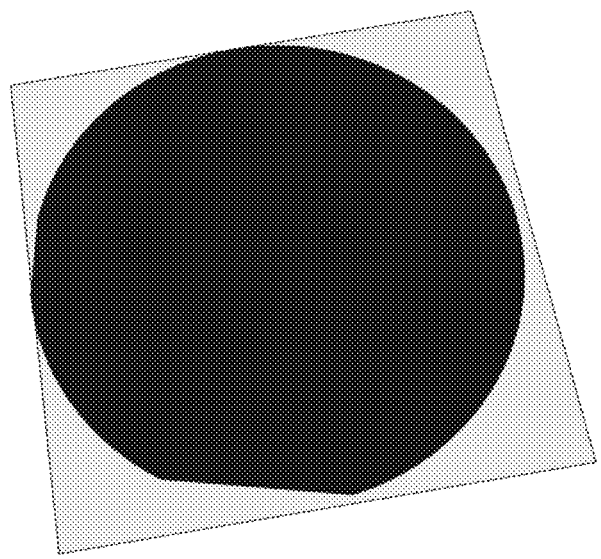
FIG. 2 shows a picture of an example temporary adhesive assembly according to an embodiment of the present disclosure, wherein the temporary adhesive assembly includes a thin silicon wafer, an adhesive glue layer, and a glass stacked in sequence.

After adhering the layer a to the layer c by the temporary adhesive provided in the embodiments of the present disclosure, a temporary adhesive assembly is obtained (as shown in FIG. 2). FIG. 2 shows a picture of an example temporary adhesive assembly according to an embodiment of the present disclosure. FIG. 2 is a picture viewed from the layer a to the layer c. As the material of the layer a is a glass and is transparent, it can be seen, through the layer a, that the adhesive glue layer b exhibits a uniform transparent state.

In addition to the temporary adhesive provided in the embodiments of the present disclosure, the adhesive glue layer may further include a photosensitive adhesive.

In some possible implementations, the adhesive glue layer merely uses the temporary adhesive provided in the embodiments of the present disclosure, and the debonding process on the adhesive glue layer is the heat debonding process. The operating parameters of the heat debonding process may be as follows: softening the adhesive glue layer at a temperature of 160° C. to 200° C. for a duration of 30 min to 60 min, followed by gradually pushing the silicon wafer (the target substrate layer c) to debond the adhesive glue layer.

In some possible implementations, the adhesive glue layer merely uses the temporary adhesive provided in the embodiments of the present disclosure, and the debonding process on the adhesive glue layer is the chemical solvent debonding process. The operating parameters of the chemical solvent debonding process may be as follows: soaking the entire temporary adhesive assembly in a good solvent of the glue layer at a temperature of 25° C. to 60° C. (e.g., the first solvent described above in the embodiments of the present disclosure, such as γ-butyrolactone) for a duration of more than 30 min.

Figure 6:
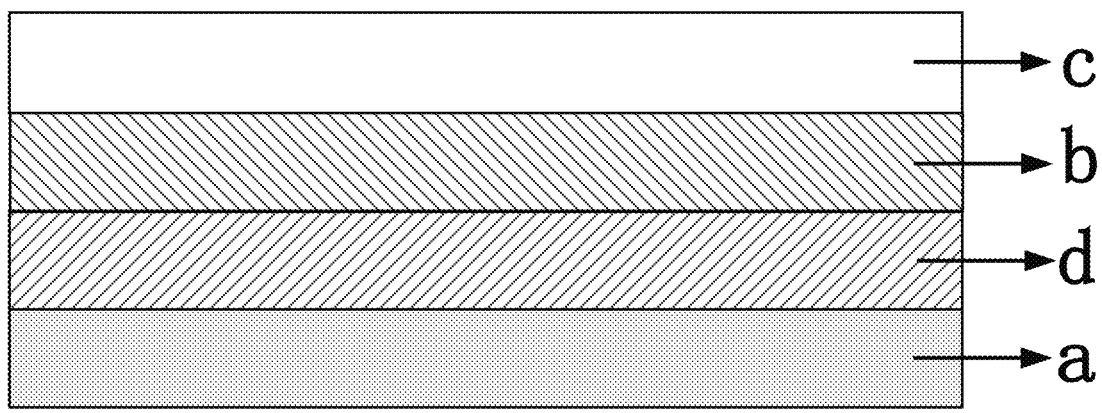
FIG. 6 is a schematic structural diagram of another example temporary adhesive assembly according to an embodiment of the present disclosure.

In some possible implementations, the adhesive glue layer uses both of the temporary adhesive provided in the embodiments of the present disclosure and the photosensitive adhesive, and the debonding process to the adhesive glue layer is the laser debonding process. The operating parameters of the laser debonding process may be as follows:

Referring to FIG. 6, a laser dissociation layer d (also referred to as the photosensitive adhesive layer, or the second glue layer) is added between the layer a and the layer b. The layer d is pre-coated on the layer a, and then coated with the layer b to adhere to the layer c to form the temporary adhesive assembly. An energy density of a laser required for irradiating and dissociating the layer d along a direction from the layer a to the layer c needs to be greater than 350 mJ/cm$^2$. With such laser, the layer d can be dissociated, thereby breaking the bonding state.

Figure 3:
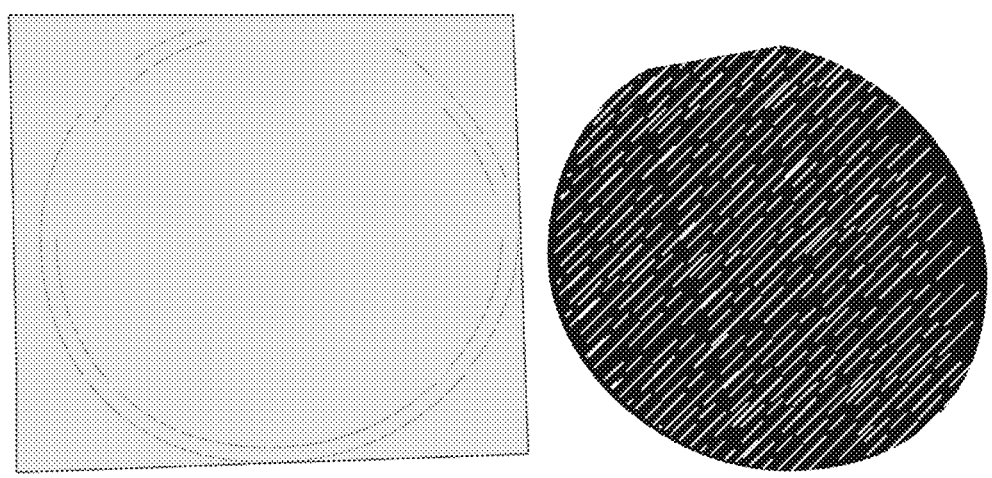
FIG. 3 shows the respective pictures of the thin silicon wafer and the glass in a detached and uncleaned state after the temporary adhesive assembly shown in FIG. 2 being detached.
Figure 4:
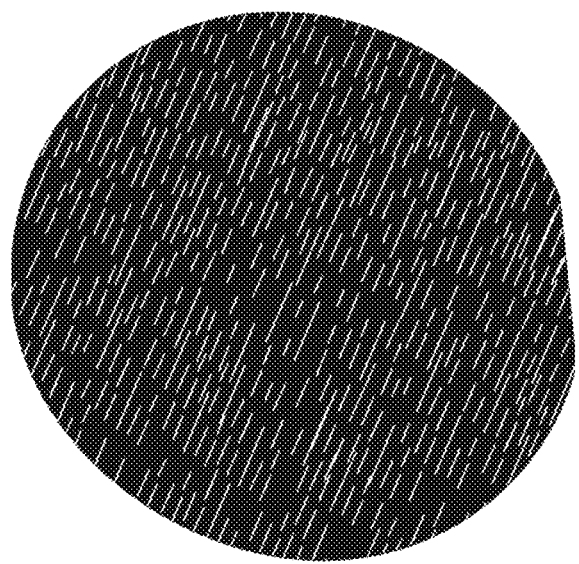
FIG. 4 shows an enlarged picture obtained by enlarging the thin silicon wafer shown in FIG. 3.

Through any of the three debonding processes described above, the temporary adhesive assembly can be disassembled smoothly. From FIG. 3 and FIG. 4, it can be clearly seen that there is residual glue on the dissociated substrate layer a and substrate layer c.

After the debonding process, the temporary adhesive remained on the first surface of the target substrate is further cleaned to obtain the processed target substrate in the embodiments of the present disclosure.

The method of applying the temporary adhesive provided in the embodiments of the present disclosure further includes a cleaning step.

In some possible implementations, after using the heat debonding process or the chemical solvent debonding process to debond the adhesive glue layer composed of the temporary adhesive, the residual glue can be cleaned by a mixture of a solvent A and a solvent B. As an example, the solvent A may include, but is not limited to, N-methylpyrrolidone, dimethylacetamide, ethyl 3-ethoxypropionate, isophorone, or the like, and the solvent B may include, but is not limited to, cyclohexanone, cyclopentanone, or the like.

Figure 5:
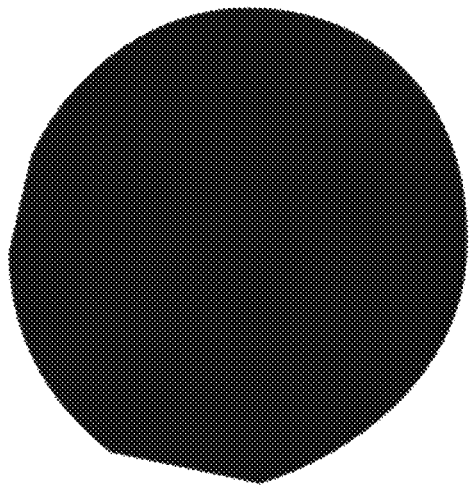
FIG. 5 shows the respective pictures of the thin silicon wafer and the glass in a detached and cleaned state after the thin silicon wafer and the glass shown in FIG. 3 being cleaned respectively.

After cleaning the substrates with the solvents described above, the surface of the substrate is clean (see FIG. 5). At this point, the layer b has been dissociated, the layer a can be recycled, and the layer c can be passed to a next process.

In the embodiments of the present disclosure, the method of cleaning the substrate may be any method known to those skilled in the art, such as a soaking method, a rinsing method, a leaching method, and the like. When using the soaking method, the residual glue is dissolved by soaking it with a solvent at a temperature of 25° C. to 60° C. for 20 min to 40 min. This method has a small impact on the thin target substrate which is an advantage, but is time consuming. When using the rinsing method or the leaching method, the surface of the substrate may be constantly washed with a wash solution at an appropriate flow rate for 3 min to 10 min, and these methods generally have a faster washing speed.

After using the laser debonding process to debond the adhesive glue layer, the residual glue needs to be cleaned with an aqueous solution of TMAH (tetramethylammonium hydroxide, CAS number: 75-59-2) in a concentration of 5 wt % to 30 wt %, e.g. by soaking the glue layer in the TMAH solution at a temperature of 30° C. to 60° C. for a duration of 10 min to 30 min, so as to remove the residual glue after dissociation of the layer d on the substrate.

EXAMPLES

The technical solutions of the present disclosure are demonstrated through the following specific examples, but the protection scope of the present disclosure is not limited to these examples. Unless otherwise specially noted, the raw materials used in the specific examples in the present disclosure are commercially available.

The raw materials used in the respective examples are as follows:

A. Polar Resins
A1. phenoxy resin PKHH, having a number average molecular weight of 32000, a MWD of 1.7, and a solution viscosity of 630 cps at a concentration of 20 wt % in a cyclohexanone solution at 25° C.
A2. phenoxy resin PKHH, having a number average molecular weight of 52000, a MWD of 2.3, a solution viscosity of 860 cps at a concentration of 20 wt % in a cyclohexanone solution at 25° C.
A3. phenoxy resin PKHB, having a number average molecular weight of 52000, a MWD of 1.5, and a solution viscosity of 900 cps at a concentration of 20 wt % in a cyclohexanone solution at 25° C.
A4. phenoxy resin PKHB, having a number average molecular weight of 26000, a MWD of 1.8, and a solution viscosity of 560 cps at a concentration of 20 wt % in a cyclohexanone solution at 25° C.
A5. phenoxy resin PKHJ, having a number average molecular weight of 26000, a MWD of 1.2, and a solution viscosity of 550 cps at a concentration of 20 wt % in a cyclohexanone solution at 25° C.
A6. phenoxy resin PKHC, having a number average molecular weight of 26000, a MWD of 2, and a solution viscosity of 580 cps at a concentration of 20 wt % in a cyclohexanone solution at 25° C.
A7. polycarbonate, having a number average molecular weight of 21000, a MWD of 1.2, and a solution viscosity of 530 cps at a concentration of 20 wt % in a cyclohexanone solution at 25° C.
A8. PEEK resin, having a number average molecular weight of 26000, a MWD of 3, and a solution viscosity of 560 cps at a concentration of 20 wt % in a cyclohexanone solution at 25° C.
A9. polyimide, having a number average molecular weight of 30000, a MWD of 2.4±0.1, and a solution viscosity of 550 cps at a concentration of 20 wt % in a cyclohexanone solution at 25° C.
A10. phenoxy resin PKHB, having a number average molecular weight of 26000, a MWD of 4, and a solution viscosity of 500 cps at a concentration of 20 wt % in a cyclohexanone solution at 25° C.

B. Light blocking materials
B1. carbon powder, 0.2 μm
B2. aluminum powder, 0.5 μm
B3. an UV572
B4. an UV390
B5. an UV571
B6. carbon powder with a particle size of 60 μm C. First Solvent
C1. GBL (γ-butyrolactone, CAS number: 96-48-0)
C2. DMAC (dimethylacetamide, CAS number: 127-19-5)
C3. EEP (ethyl 3-ethoxypropionate, CAS number: 763-69-9)
C. NMP (N-methylpyrrolidone, CAS number: 872-50-4)

D. Second Solvent
D1. cyclohexanone
D2. cyclopentanone
D3. NMP (N-methylpyrrolidone, CAS number: 872-50-4)

Examples 1 to 20 and Comparative Examples 1 to 6 each provide a temporary adhesive, and the respective compositions thereof are shown in Table 1.

TABLE 1

| Examples | A | B | C | D | Using effect |
| --- | --- | --- | --- | --- | --- |
| Example 1 | A1-30 wt % | B1-5 wt % | C1-30 wt % | D1-35 wt % | Normal use |
| Example 2 | A3-10 wt % | B1-10 wt % | C2-30 wt % | D2-50 wt % | Normal use |
| Example 3 | A4-30 wt % | B3-5 wt % | C1-30 wt % | D2-35 wt % | Normal use |

TABLE 1-continued

| Examples | A | B | C | D | Using effect |
|---|---|---|---|---|---|
| Example 4 | A7-20 wt % | B4-1 wt % | C2-35 wt % | D3-44 wt % | Normal use |
| Example 5 | A2-10 wt % | B4-1 wt % | C3-40 wt % | D2-49 wt % | Normal use |
| Example 6 | A7-5 wt % | B5-1 wt % | C2-30 wt % | D3-64 wt % | Normal use |
| Example 7 | A5-10 wt % | B2-5 wt % | C3-35 wt % | D3-50 wt % | Normal use |
| Example 8 | A7-50 wt % | B2-1 wt % | C3-20 wt % | D2-29 wt % | Normal use |
| Example 9 | A2-15 wt % | B1-5 wt % | C1-30 wt % | D1-50 wt % | Normal use |
| Example 10 | A4-10 wt % | B1-10 wt % | C2-30 wt % | D2-50 wt % | Normal use |
| Example 11 | A6-30 wt % | B3-5 wt % | C1-35 wt % | D2-30 wt % | Normal use |
| Example 12 | A7-25 wt % | B4-1 wt % | C2-35 wt % | D3-39 wt % | Normal use |
| Example 13 | A2-25 wt % | B4-1 wt % | C4-35 wt % | D2-39 wt % | Normal use |
| Example 14 | A7-5 wt % | B5-1 wt % | C2-45 wt % | D3-49 wt % | Normal use |
| Example 15 | A8-15 wt % | B2-5 wt % | C3-35 wt % | D3-45 wt % | Normal use |
| Example 16 | A7-20 wt % | B2-10 wt % | C3-30 wt % | D2-40 wt % | Normal use |
| Example 17 | A4-40 wt % | B3-5 wt % | C1-30 wt % | D2-25 wt % | Normal use |
| Example 18 | A7-30 wt % | B4-1 wt % | C2-35 wt % | D3-34 wt % | Normal use |
| Example 19 | A5-35 wt % | B2-5 wt % | C3-35 wt % | D3-25 wt % | Normal use |
| Example 20 | A8-30 wt % | B2-10 wt % | C3-40 wt % | D2-20 wt % | Normal use |
| Comparative Example 1 | A9-30 wt % | B1-5 wt % | C1-30 wt % | D1-35 wt % | unable to bond |
| Comparative Example 2 | A1-30 wt % | — | C1-30 wt % | D1-40 wt % | No light blocking effect |
| Comparative Example 3 | A10-30 wt % | B1-5 wt % | C1-30 wt % | D1-35 wt % | Bad heat resistant |
| Comparative Example 4 | A1-30 wt % | B1-25 wt % | C1-30 wt % | D1-15 wt % | unable to debond |
| Comparative Example 5 | A1-15 wt % | B1-5 wt % | C1-15 wt % | D1-65 wt % | Resin precipitation occurs |
| Comparative Example 6 | A1-30 wt % | B6-5 wt % | C1-30 wt % | D1-35 wt % | Non-uniform coating |

By comparing the various Examples and Comparative Examples 1 and 3, it can be seen that the aforementioned polar resins selected by the examples of the present disclosure make the temporary adhesive have an excellent bonding capacity and good heat resistance. It can be seen from Comparative Example 2 that the addition of the light blocking material into the adhesive can impart a light blocking effect to the temporary adhesive. However, as can be seen from Comparative Example 4, when excess amount of light blocking material is added, the debonding performance of the adhesive would be compromised. In addition, the amount of the solvents may also affect the performance of the adhesive. Referring to Comparative Example 5, when the second solvent is too much and the first solvent is too little, the solubility of the resin is poor, and the resin is easy to precipitate, resulting in that the temporary adhesive is difficult to coat.

The present disclosure further provides a method of preparing the aforementioned temporary adhesives and a method of applying the temporary adhesives. The methods include the following steps:

a. formulation of the temporary adhesive: adding a polar resin into a mixture of a first solvent and a second solvent, mixing and stirring the obtained mixture until the resin is completely dissolved (optionally, a light blocking material may be further added until fully dispersed), so as to obtain the temporary adhesive;

b. coating: coating the temporary adhesive on a carrier substrate with a coating speed of 1000 rpm to 3000 rpm for a duration of 15 s to 30 s, and baking the coated carrier substrate at a temperature of 150° C. to 210° C. for a duration of 120 s to 300 s. In some examples, the coating speed is 2000 rpm, and after spin coating for 30 s, the coated carrier substrate is baked at 180° C. for 180 s;

c. adhering: contacting a target substrate with a coating liquid film of the temporary adhesive and then placing the substrate in a machine specific for the adhering step; evacuating the substrate to a pressure of less than 10 mbar for longer than 10 min and heating the substrate to a temperature of 180 to 220° C.; and pressing the substrate with a pressing force of greater than 3000 N for at least 2 min while maintaining the vacuum; finishing the pressing and breaking the vacuum, and then completing the adhering between the carrier substrate and the target substrate, so as to form the temporary adhesive assembly as shown in FIG. 1, wherein an adhesive glue layer is formed from the temporary adhesive;

d. debonding: when a chemical solvent debonding process method is used, the adhesive glue layer is debonded by the chemical solvent permeating from the edge; and when a laser debonding process is used, a photosensitive adhesive is combined to conduct the debonding process;

e. cleaning: after completing the debonding process, soaking the disassembled target substrate and carrier substrate in a cleaning solvent, wherein the cleaning solvent is a mixture of solvent A and solvent B in a volume ratio of 1:1. The solvent A includes, but is not limited to, N-methylpyrrolidone, dimethylacetamide, ethyl 3-ethoxypropionate, isophorone, and the like, and the solvent B includes, but is not limited to, cyclohexanone, cyclopentanone, and the like. The cleaning process is conducted under a temperature of 20 to 60° C. by soaking the substrates for 20-30 min, purging the surface of the substrates with nitrogen; cleaning the surface with acetone; and then purging the surface of the substrates with nitrogen again. When no residual glue greater than 5 μm is observed under a microscope, the cleaning process is completed.

The Procedures of Performance Tests and the Result of the Tests

1. Tests on the chemical resistance performance: a chemical solvent/solution for test is heated to a corresponding temperature, and a sample to be tested (i.e., the temporary adhesive assembly shown in FIG. 1) is soaked in the chemical solvent/solution. After soaking the sample at the corresponding temperature for a corresponding time period, whether the bonding state is broken is observed. If the sample is disassembled, the state is represented by NG; and if the sample is not disassembled, the sample is then used for testing the next solvent. If the temporary adhesive assembly can withstand continuous solvent soaking and is not disassembled, then the assembly passes the test, and is represented by OK. The specific solvent species and soaking conditions are shown in Table 2, and the results of the chemical resistance test of Examples 1 to 20 and Comparative Examples 1 to 6 are shown in Table 3.

TABLE 2

| Reagent No. | Chemical Reagent/Solution For Test | Tolerant Time For Test | Tolerant Temperature For Test |
|---|---|---|---|
| 1 | acetone | >60 min | 25° C. |
| 2 | isopropanol | >30 min | 25° C. |
| 3 | methanol | >30 min | 25° C. |
| 4 | alcohol | >60 min | 25° C. |
| 5 | 30% ammonia solution | >30 min | 25° C. |
| 6 | NMP | >30 min | 60° C. |
| 7 | 36% sulfuric acid | >30 min | 25° C. |
| 8 | 3% TMAH (tetramethylammonium hydroxide) | >30 min | 25° C. |
| 9 | KS5703/KS5306 (liquid developer) | >30 min | 45° C. |
| 10 | KS3502/KS3504 (de-gluing solution) | >60 min | 45° C. |
| 11 | benzene | >30 min | 25° C. |
| 12 | toluene | >30 min | 25° C. |

TABLE 3

| | Reagent No. | | | | | | | | | | | |
|---|---|---|---|---|---|---|---|---|---|---|---|---|
| Example | 1 | 2 | 3 | 4 | 5 | 6 | 7 | 8 | 9 | 10 | 11 | 12 |
| Example 1 | OK | OK | OK | OK | OK | NG | OK | OK | OK | NG | OK | OK |
| Example 2 | OK | OK | OK | OK | OK | NG | OK | OK | OK | NG | OK | OK |
| Example 3 | OK | OK | OK | OK | OK | NG | OK | OK | OK | NG | OK | OK |
| Example 4 | OK | OK | OK | OK | OK | NG | OK | OK | OK | NG | OK | OK |
| Example 5 | OK | OK | OK | OK | OK | NG | OK | OK | OK | NG | OK | OK |
| Example 6 | OK | OK | OK | OK | OK | NG | OK | OK | OK | NG | OK | OK |
| Example 7 | OK | OK | OK | OK | OK | NG | OK | OK | OK | NG | OK | OK |
| Example 8 | OK | OK | OK | OK | OK | NG | OK | OK | OK | NG | OK | OK |
| Example 9 | OK | OK | OK | OK | OK | NG | OK | OK | OK | NG | OK | OK |
| Example 10 | OK | OK | OK | OK | OK | NG | OK | OK | OK | NG | OK | OK |
| Example 11 | OK | OK | OK | OK | OK | NG | OK | OK | OK | NG | OK | OK |
| Example 12 | OK | OK | OK | OK | OK | NG | OK | OK | OK | NG | OK | OK |
| Example 13 | OK | OK | OK | OK | OK | NG | OK | OK | OK | NG | OK | OK |
| Example 14 | OK | OK | OK | OK | OK | NG | OK | OK | OK | NG | OK | OK |
| Example 15 | OK | OK | OK | OK | OK | NG | OK | OK | OK | NG | OK | OK |
| Example 16 | OK | OK | OK | OK | OK | NG | OK | OK | OK | NG | OK | OK |
| Example 17 | OK | OK | OK | OK | OK | NG | OK | OK | OK | NG | OK | OK |
| Example 18 | OK | OK | OK | OK | OK | NG | OK | OK | OK | NG | OK | OK |
| Example 19 | OK | OK | OK | OK | OK | NG | OK | OK | OK | NG | OK | OK |
| Example 20 | OK | OK | OK | OK | OK | NG | OK | OK | OK | NG | OK | OK |
| Comparative Example 1 | OK | OK | OK | OK | OK | NG | OK | NG | NG | NG | OK | OK |
| Comparative Example 2 | OK | OK | OK | OK | OK | NG | OK | OK | OK | NG | OK | OK |
| Comparative Example 3 | OK | OK | OK | OK | OK | NG | OK | OK | OK | NG | OK | OK |
| Comparative Example 4 | OK | OK | OK | OK | OK | NG | OK | OK | OK | NG | OK | OK |
| Comparative Example 5 | — | — | — | — | — | — | — | — | — | — | — | — |
| Comparative Example 6 | — | — | — | — | — | — | — | — | — | — | — | — |

2. Tests on the heat resistance performance: the temporary adhesive assembly is placed on a heating plate and heated, and a thermometric gun/thermocouple thermometer is used to measure its temperature. Under the conditions of 100° C., 150° C., 200° C., 250° C. and 300° C., whether a silicon wafer (the target substrate c) and a glass sheet (the carrier substrate a) bonded together are slid relative to each other is observed, then they are taken out to return to an ambient temperature. If the bonding capacity and resistance to chemical solvent penetration are not affected, and the bonding state is still kept, the temporary adhesive of the temporary adhesive assembly passes the heat resistance test. Here, the heat resistance being OK means that after the temporary adhesive assembly bonded by the temporary adhesive reaches the specific high temperature, the core component and structure of the temporary adhesive are not destroyed; and when the temperature falls back to the ambient temperature, the adhesive glue layer can still have a bonding capacity and maintain the assembly bonded. Whereas NG refers to the condition that the adhesive glue layer loses its bonding capacity and the assembly is disassembled at the specific high temperature; and when returning to a lower operating temperature, the adhesive glue layer still loses its bonding capacity. The results of the tests of Examples 1 to 20 and Comparative Examples 1 to 6 are shown in Table 4.

TABLE 4

| Heat Resistance | 100° C. | 150° C. | 200° C. | 250° C. | 3 00° C. |
| --- | --- | --- | --- | --- | --- |
| Example 1 | OK | OK | OK | OK | OK |
| Example 2 | OK | OK | OK | OK | OK |
| Example 3 | OK | OK | OK | OK | OK |
| Example 4 | OK | OK | OK | OK | OK |
| Example 5 | OK | OK | OK | OK | OK |
| Example 6 | OK | OK | OK | OK | OK |
| Example 7 | OK | OK | OK | OK | OK |
| Example 8 | OK | OK | OK | OK | OK |
| Example 9 | OK | OK | OK | OK | OK |
| Example 10 | OK | OK | OK | OK | OK |
| Example 11 | OK | OK | OK | OK | OK |
| Example 12 | OK | OK | OK | OK | OK |
| Example 13 | OK | OK | OK | OK | OK |
| Example 14 | OK | OK | OK | OK | OK |
| Example 15 | OK | OK | OK | OK | OK |
| Example 16 | OK | OK | OK | OK | OK |
| Example 17 | OK | OK | OK | OK | OK |
| Example 18 | OK | OK | OK | OK | OK |
| Example 19 | OK | OK | OK | OK | OK |
| Example 20 | OK | OK | OK | OK | OK |
| Comparative Example 1 | unable to bond | unable to bond | unable to bond | unable to bond | unable to bond |
| Comparative Example 2 | OK | OK | OK | OK | OK |
| Comparative Example 3 | OK | OK | NG | NG | NG |
| Comparative Example 4 | OK | OK | OK | OK | OK |
| Comparative Example 5 | — | — | — | — | — |
| Comparative Example 6 | — | — | — | — | — |

3. Tests on debonding performance when using the chemical soaking method: the temporary adhesive assembly is placed on a heating plate, and the soaking test is performed by using an initial solvent (i.e., the solvent used in each example) at 25±1'C and 60±5° C. respectively. If there is solvent penetration after soaking for 30±1 mi, and the bonding state is gradually broken, the debonding performance is excellent. Otherwise, the debonding performance test is not passed. The results of the debonding performance tests when using the chemical soaking method of Examples 1 to 20 and Comparative Examples 1 to 6 are shown in Table 5.

TABLE 5

| Example | Debonding Effect at 25 ± 1° C. | Debonding Effect at 60 ± 5° C. |
| --- | --- | --- |
| Example 1 | OK | OK |
| Example 2 | OK | OK |
| Example 3 | OK | OK |
| Example 4 | OK | OK |
| Example 5 | OK | OK |
| Example 6 | OK | OK |
| Example 7 | OK | OK |
| Example 8 | OK | OK |
| Example 9 | OK | OK |
| Example 10 | OK | OK |
| Example 11 | OK | OK |
| Example 12 | OK | OK |
| Example 13 | OK | OK |
| Example 14 | OK | OK |
| Example 15 | OK | OK |
| Example 16 | OK | OK |
| Example 17 | OK | OK |
| Example 18 | OK | OK |
| Example 19 | OK | OK |
| Example 20 | OK | OK |
| Comparative Example 1 | no bonding effect | no bonding effect |
| Comparative Example 2 | OK | OK |

TABLE 5-continued

| Example | Debonding Effect at 25 ± 1° C. | Debonding Effect at 60 ± 5° C. |
|---|---|---|
| Comparative Example 3 | OK | OK |
| Comparative Example 4 | NG | NG |
| Comparative Example 5 | no bonding effect | no bonding effect |
| Comparative Example 6 | no bonding effect | no bonding effect |

4. Tests on bonding capacity: two rectangular copper sheets are taken and the end surfaces thereof are bonded by using one of the temporary adhesives provided in the above Examples or Comparative Examples. The area of the bonded part is 12 mm×65 mm. After the bonding, a CMTS4103 modulus apparatus is used to measure the mechanical force required for pulling the two copper sheets apart. When the thickness of the adhesive as tested is between 1 μm and 100 μm, if the force required for pulling the two copper sheets apart is greater than 400 N, it is considered that the lateral shear force resistance requirements during the manufacture procedure can be met. In this case, the bonding effect, that is, the bonding capacity, is denoted as OK. Whereas if the two copper sheets can be pulled apart with a normal force, the debonding effect is denoted as OK. The results of the bonding capacity tests of Examples 1 to 20 and Comparative Examples 1 to 6 are shown in Table 6.

TABLE 6

| Example | Bonding Effect | Debonding Effect |
|---|---|---|
| Example 1 | OK | OK |
| Example 2 | OK | OK |
| Example 3 | OK | OK |
| Example 4 | OK | OK |
| Example 5 | OK | OK |
| Example 6 | OK | OK |
| Example 7 | OK | OK |
| Example 8 | OK | OK |
| Example 9 | OK | OK |
| Example 10 | OK | OK |
| Example 11 | OK | OK |
| Example 12 | OK | OK |
| Example 13 | OK | OK |
| Example 14 | OK | OK |
| Example 15 | OK | OK |
| Example 16 | OK | OK |
| Example 17 | OK | OK |
| Example 18 | OK | OK |
| Example 19 | OK | OK |
| Example 20 | OK | OK |
| Comparative Example 1 | no bonding effect | no bonding effect |
| Comparative Example 2 | OK | OK |
| Comparative Example 3 | OK | OK |
| Comparative Example 4 | unable to bond uniformly | unable to bond uniformly |
| Comparative Example 5 | unable to bond uniformly | unable to bond uniformly |
| Comparative Example 6 | unable to bond uniformly | unable to bond uniformly |

5. Tests on light blocking performance: a sample to be tested is coated on a standard transparent glass sheet to form a layer to be tested having a thickness of 1±0.05 μm. Then an empty glass sheet is taken as background and the light transmittance at 355 nm is tested by the UV spectrophotometer. The results of the light blocking performance tests of Examples 1 to 20 and Comparative Examples 1 to 6 are shown in Table 7.

TABLE 7

| Example | Laser Transmittance at 355 nm |
|---|---|
| Example 1 | 35 |
| Example 2 | 20 |
| Example 3 | 35 |
| Example 4 | 36 |
| Example 5 | 38 |
| Example 6 | 38 |
| Example 7 | 32 |
| Example 8 | 26 |
| Example 9 | 34 |
| Example 10 | 20 |
| Example 11 | 37 |
| Example 12 | 34 |
| Example 13 | 37 |
| Example 14 | 40 |
| Example 15 | 22 |
| Example 16 | 30 |
| Example 17 | 34 |
| Example 18 | 24 |
| Example 19 | 31 |
| Example 20 | 26 |
| Comparative Example 1 | 55 |
| Comparative Example 2 | 90 |
| Comparative Example 3 | 75 |
| Comparative Example 4 | 15 |
| Comparative Example 5 | — |
| Comparative Example 6 | — |

As can be seen from Examples 1 to 20, by selecting a particular polar resin and combining the suitable solvents, the temporary adhesives provided in the present disclosure can resist a temperature as high as 300° C. Also, the temporary adhesives can withstand soaking of an acid, a base and a non-polar organic solvent included in the processing procedures, and the bonding capacity is not affected. Thus, the adhesive glue layer composed of the temporary adhesives can have the advantages of being easy to clean; having resistance against high temperature, having resistance when being soaked in acid, base, and non-polar organic solvents; and being easy to coat and apply. In addition, the use of an appropriate light blocking material may further impart the temporary adhesives with a laser resistance performance.

The disclosure set forth above may encompass multiple distinct examples with independent utility. Although each of these has been disclosed, the specific embodiments thereof as disclosed and illustrated herein are not to be considered in a limiting sense, because numerous variations are possible. The subject matter of the disclosure includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A temporary adhesive, comprising: a polar resin of 5 wt % to 50 wt %, a first solvent of 30 wt % to 90 wt %, and a second solvent of 5 wt % to 60 wt %,
   wherein the polar resin comprises at least one selected from a group consisting of a phenoxy resin, a poly(ether-ether-ketone) resin, a polycarbonate resin, a modified epoxy resin, or a polyolefin resin with a modified polar group;
   the first solvent is used to dissolve the polar resin; and
   the second solvent is used to improve a leveling property of the temporary adhesive.

2. The temporary adhesive according to claim 1, wherein the polar resin has a number average molecular weight of between 10,000 and 100,000, and a MWD of between 1 and 3.5.

3. The temporary adhesive according to claim 1, wherein the first solvent comprises at least one selected from a group consisting of an ester-based solvent, a ketone-based solvent, a sulfone-based solvent, or an amide-based solvent.

4. The temporary adhesive according to claim 3, wherein the first solvent comprises at least one selected from a group consisting of ethyl 3-ethoxypropionate, ethyl acetate, n-butyl acetate, ethyl lactate, γ-butyrolactone, methyl ethyl ketone, methyl isobutyl ketone, isophorone, propylene glycol methyl ether acetate, dimethyl sulfoxide, dimethyl sulfone, dimethylacetamide, or N,N-dimethylformamide.

5. The temporary adhesive according to claim 1, wherein the second solvent comprises at least one selected from a group consisting of an ester-based solvent, a ketone-based solvent, a sulfone-based solvent, or an amide-based solvent.

6. The temporary adhesive according to claim 5, wherein the second solvent comprises at least one selected from a group consisting of N-methylpyrrolidone, N,N-dimethylformamide, cyclohexanone, or cyclopentanone.

7. The temporary adhesive according to claim 1, further comprising a light blocking material, wherein a weight percentage of the light blocking material in the temporary adhesive is between 0.1 wt % and 20 wt %.

8. The temporary adhesive according to claim 7, wherein the light blocking material comprises at least one selected from a group consisting of a metal powder, a metal oxide powder, a carbon powder, or an organic substance having an absorption effect on ultraviolet light of a wavelength from 290 nm to 350 nm.

9. The temporary adhesive according to claim 8, wherein the metal powder comprises at least one of aluminum powder, or silver powder;
   the metal oxide powder comprises at least one of titanium dioxide powder, aluminum oxide powder, magnesium oxide powder, or calcium oxide powder;
   the organic substance having the absorption effect on the ultraviolet light of the wavelength from 290 nm to 350 nm comprises at least one of an organic substance comprising an amide group and/or an imide group, or benzotriazole.

10. The temporary adhesive according to claim 7, wherein the light blocking material has a particle size ranging from 0.2 μm to 40 μm.

11. A temporary adhesive assembly, wherein the temporary adhesive assembly comprises a target substrate which is a substrate to be processed, a carrier substrate, and an adhesive glue layer, and the target substrate is adhered to the carrier substrate by the adhesive glue layer; and
   wherein the adhesive glue layer comprises a first glue layer formed from the temporary adhesive of claim 1.

12. The temporary adhesive assembly according to claim 11, wherein the adhesive glue layer further comprises a second glue layer, the first glue layer and the second glue layer are in a stacked configuration and the second glue layer is formed from a photosensitive adhesive; and
   the first glue layer is adhered to the target substrate, and the second glue layer is adhered to the carrier substrate.

13. The temporary adhesive assembly according to claim 11, wherein the target substrate is a semiconductor wafer.

14. The temporary adhesive assembly according to claim 11, wherein the carrier substrate comprises a wafer substrate, a glass substrate, a quartz substrate, a silica substrate, or a polymer substrate.

15. A method of processing a target substrate, comprising:
   applying the temporary adhesive of claim 1 to the target substrate.

16. The method according to claim 15, comprising:
   providing a carrier substrate and the target substrate, wherein the carrier substrate has a support surface and the target substrate has a first surface and a second surface that are opposite to each other;
   adhering the support surface of the carrier substrate to the first surface of the target substrate by an adhesive glue layer to form a temporary adhesive assembly, wherein the adhesive glue layer comprises a first glue layer formed from the temporary adhesive;
   treating the second surface of the target substrate on the temporary adhesive assembly to obtain a treated temporary adhesive assembly;
   performing a debonding process on the treated temporary adhesive assembly to detach the first surface of the target substrate from the carrier substrate; and
   cleaning the temporary adhesive remaining on the first surface of the target substrate to obtain a processed target substrate.

17. The method according to claim 16, wherein the adhesive glue layer further comprises a second glue layer, the second glue layer and the first glue layer are in a stacked configuration, and the second glue layer is formed from a photosensitive adhesive.

18. The method according to claim 17, wherein treating the second surface of the target substrate on the temporary adhesive assembly, comprises:
   performing a wafer thinning treatment, a stress releasing treatment, a dry etch treatment, a redistribution line packaging treatment, a physical vapor deposition treatment, or a ball mounting treatment to the second surface of the target substrate.

19. The method according to claim 17, wherein the debonding process comprises: a heat debonding process, a chemical solvent debonding process, or a laser debonding process; and
   the laser debonding process is applied to the second glue layer to perform the debonding process.

20. The method according to claim 16, wherein treating the second surface of the target substrate on the temporary adhesive assembly, comprises:
   performing a wafer thinning treatment, a stress releasing treatment, a dry etch treatment, a redistribution line packaging treatment, a physical vapor deposition treatment, or a ball mounting treatment to the second surface of the target substrate.

* * * * *